US010101244B2

(12) United States Patent
Mankovskii et al.

(10) Patent No.: US 10,101,244 B2
(45) Date of Patent: Oct. 16, 2018

(54) SELF-LEARNING SIMULATION ENVIRONMENTS

(71) Applicants: Serge Mankovskii, Morgan Hill, CA (US); Steven L. Greenspan, Scotch Plains, NJ (US); Debra J. Danielson, Skillman, NJ (US); Prashant Parikh, Holtsville, NY (US); Maria C. Velez-Rojas, San Jose, CA (US); James D. Reno, Scotts Valley, CA (US)

(72) Inventors: Serge Mankovskii, Morgan Hill, CA (US); Steven L. Greenspan, Scotch Plains, NJ (US); Debra J. Danielson, Skillman, NJ (US); Prashant Parikh, Holtsville, NY (US); Maria C. Velez-Rojas, San Jose, CA (US); James D. Reno, Scotts Valley, CA (US)

(73) Assignee: CA, Inc., New York, NY (US)

( * ) Notice: Subject to any disclaimer, the term of this patent is extended or adjusted under 35 U.S.C. 154(b) by 402 days.

(21) Appl. No.: 14/636,135

(22) Filed: Mar. 2, 2015

(65) Prior Publication Data
US 2016/0258845 A1    Sep. 8, 2016

(51) Int. Cl.
*G06F 11/30* (2006.01)
*G01M 99/00* (2011.01)
(Continued)

(52) U.S. Cl.
CPC ....... *G01M 99/008* (2013.01); *G05B 23/0275* (2013.01); *G06F 11/00* (2013.01);
(Continued)

(58) Field of Classification Search
CPC ........ G06Q 20/12; G06Q 20/40; G06Q 20/02; G06Q 20/0855; G06Q 20/3674; G06Q 20/382; G06Q 20/4012; G06Q 20/4014; G06Q 20/027; G06Q 20/04; G06Q 20/341; G06Q 20/355; G06Q 20/367; G06Q 20/3829
See application file for complete search history.

(56) References Cited

U.S. PATENT DOCUMENTS

2011/0060569 A1*    3/2011    Lynn ................... G06F 11/0739
703/6

* cited by examiner

*Primary Examiner* — Robert Bachner
(74) *Attorney, Agent, or Firm* — Baker Botts L.L.P.

(57) ABSTRACT

Systems and methods may include receiving data of a physical system. The systems and methods may include determining whether an anomalous event has occurred based on the data. The systems and methods may include, in response to determining that the anomalous event has occurred, capturing data of the physical system and of an environment. The systems and methods may include generating a virtual representation of the physical system and the environment based on the captured data. The systems and methods may include repeatedly simulating data of the virtual representation by varying parameters of the captured data. The systems and methods may include determining which parameters are a root cause of the anomalous event based on the simulated performance data. The systems and methods may include determining particular values of the parameters that are likely the root cause of the anomalous event to use as a trigger for a proactive process.

20 Claims, 6 Drawing Sheets

(51) Int. Cl.
   *G06F 11/00* (2006.01)
   *G06F 11/07* (2006.01)
   *G05B 23/02* (2006.01)
   *G06F 17/50* (2006.01)
   *H04L 29/00* (2006.01)
(52) U.S. Cl.
   CPC ........ *G06F 11/0709* (2013.01); *G06F 11/079* (2013.01); *G06F 17/5009* (2013.01); *H04L 29/00* (2013.01)

SELF-LEARNING SIMULATION ENVIRONMENTS

BACKGROUND

The present disclosure relates to infrastructure management and, more specifically, to systems and methods for self-learning simulation environments.

As the so-called Internet of Things expands, an increasing number of smart devices have been developed to interconnect within the existing Internet infrastructure and other networks. Such devices may be used to collect information and to automate a growing number of important tasks in a variety of fields.

BRIEF SUMMARY

According to an aspect of the present disclosure, a method may include several processes. In particular, the method may include receiving performance data of a physical system. The method may further include determining whether an anomalous event has occurred in the physical system based on the performance data. In addition, the method may include, in response to determining that the anomalous event has occurred in the physical system, capturing data of the physical system and data of an environment of the physical system. The method also may include generating a virtual representation of the physical system and the environment based on the captured data of the physical system and the captured data of the environment. Moreover, the method may include repeatedly simulating performance data of the virtual representation by selectively varying one or more parameters of the captured data of at least one of the physical system and the environment. Further still, the method may include determining which parameters of the one or more parameters are likely a root cause of the anomalous event based on the repeatedly simulated performance data of the virtual representation. Also, the method may include determining particular values of the parameters that are likely the root cause of the anomalous event to use as a trigger for a proactive process to address the anomalous event.

Other objects, features, and advantages will be apparent to persons of ordinary skill in the art from the following detailed description and the accompanying drawings.

BRIEF DESCRIPTION OF THE DRAWINGS

Aspects of the present disclosure are illustrated by way of example and are not limited by the accompanying figures with like references indicating like elements.

DETAILED DESCRIPTION

Figure 1:
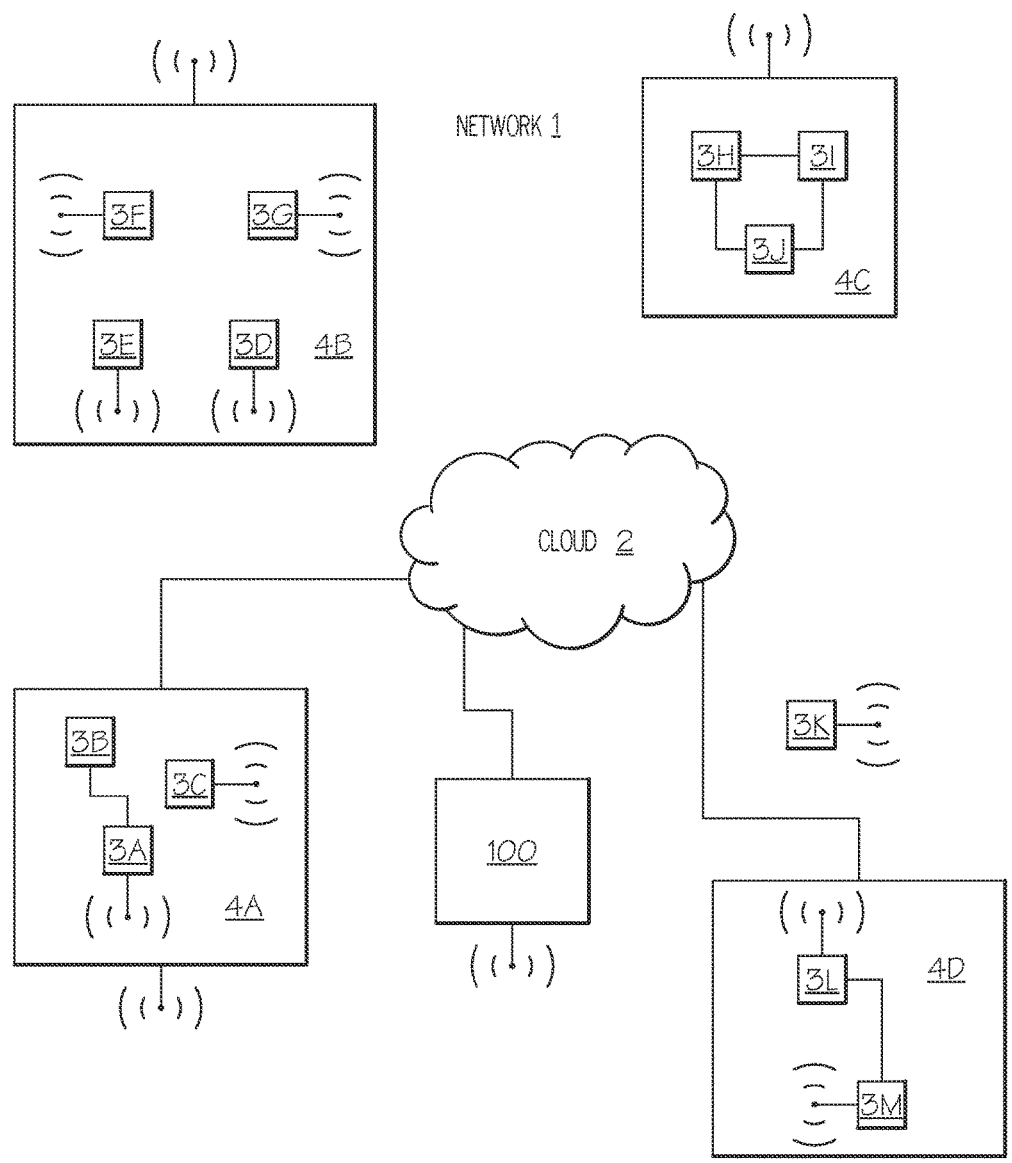
FIG. 1 is a schematic representation of a network 1 on which systems and methods for self-learning simulation environments may be implemented.

As will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely in hardware, entirely in software (including firmware, resident software, micro-code, etc.) or in a combined software and hardware implementation that may all generally be referred to herein as a "circuit," "module," "component," or "system." Furthermore, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would comprise the following: a portable computer diskette, a hard disk, a random access memory ("RAM"), a read-only memory ("ROM"), an erasable programmable read-only memory ("EPROM" or Flash memory), an appropriate optical fiber with a repeater, a portable compact disc read-only memory ("CD-ROM"), an optical storage device, a magnetic storage device, or any suitable combination of the foregoing. In the context of this document, a computer readable storage medium may be any tangible medium able to contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take a variety of forms comprising, but not limited to, electro-magnetic, optical, or a suitable combination thereof. A computer readable signal medium may be a computer readable medium that is not a computer readable storage medium and that is able to communicate, propagate, or transport a program for use by or in connection with an instruction execution system, apparatus, or device. Program code embodied on a computer readable signal medium may be transmitted using an appropriate medium, comprising but not limited to wireless, wireline, optical fiber cable, RF, etc., or any suitable combination of the foregoing.

Computer program code for carrying out operations for aspects of the present disclosure may be written in a combination of one or more programming languages, comprising an object oriented programming language such as JAVA®, SCALA®, SMALLTALK®, EIFFEL®, JADE®, EMERALD®, C++, C#, VB.NET, PYTHON® or the like, conventional procedural programming languages, such as the "C" programming language, VISUAL BASIC®, FORTRAN®2003, Perl, COBOL 2002, PHP, ABAP®, dynamic programming languages such as PYTHON®, RUBY® and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider) or in a cloud computing environment or offered as a service such as a Software as a Service ("SaaS").

Aspects of the present disclosure are described herein with reference to flowchart illustrations and/or block diagrams of methods, apparatuses (e.g., systems), and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that, when executed, may direct a computer, other programmable data processing apparatus, or other devices to function in a particular manner, such that the instructions, when stored in the computer readable medium, produce an article of manufacture comprising instructions which, when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses, or other devices to produce a computer implemented process, such that the instructions which execute on the computer or other programmable apparatus provide processes for implementing the functions/acts specified in the flowchart and/or block diagram block or blocks.

While certain example systems and methods disclosed herein may be described with reference to infrastructure management and, more specifically, to self-learning simulation environments, as related to managing and deploying resources in an IoT infrastructure, systems and methods disclosed herein may be related to other areas beyond the IoT and may be related to aspects of IoT other than the example implementations described herein. Systems and methods disclosed herein may be applicable to a broad range of applications that require access to networked resources and infrastructure and that are associated with various disciplines, such as, for example, research activities (e.g., research and design, development, collaboration), commercial activities (e.g., sales, advertising, financial evaluation and modeling, inventory control, asset logistics and scheduling), IT systems (e.g., computing systems, cloud computing, network access, security, service provisioning), and other activities of importance to a user or organization.

As described below in more detail, aspects of this disclosure may be described with respect to particular example implementations. For example, this disclosure often refers to the example of one or more convoys of trucks operating in one or more geographic locations for one or more organizations. Nevertheless, such example implementations are not limiting examples, but rather are provided for the purposes of explanation. Accordingly, the concepts set forth in this disclosure may be applied readily to a variety of fields and industries and should not be limited to merely the example implementations described herein.

The recent explosion of network-enabled components has presented the opportunity to monitor and study systems over a range of levels. In particular, numerous connected sensors and components are now available and may be incorporated into a variety of systems to enable the real-time monitoring of the system as a whole and the system's components on a discrete level. Such connectivity, however, also opens the door for malicious actors to improperly obtain data from these network-enabled sensors and components or even to hijack such sensors and components for their own malicious purposes.

Certain implementations disclosed herein may permit administrators to implement real-time performance monitoring, evaluation, and diagnosis of components deployed in the field, as well as real-time monitoring, evaluation, and diagnosis of data produced by such components.

In particular implementations, systems and methods disclosed herein may use telemetry data received from a plurality of devices to identify anomalous events, generate virtual representations of the devices and their environment, and repeatedly simulate interactions between the devices and their environment to identify parameters of the telemetry data that appear to be root causes of the anomalous event. Such systems and methods may establish alerts, alarms, or other proactive measures that may be triggered when the root cause parameters reach certain values in the future. In this manner, such systems and methods may dynamically learn about the devices and their environment and take proactive measures to avoid the occurrence of anomalous events.

In some implementations, systems and methods disclosed herein may rely on dynamically updated models to predict the occurrence of anomalous events based on real-time telemetry data from a plurality of devices and real-time data about their environments. When the occurrence of an anomalous event is predicted, such systems and methods may implement alerts, alarms, or other proactive measures. At times however, the models may incorrectly predict the occurrence of an anomalous event, which may lead to false positive indicators of the anomalous event. Such systems and methods, may further analyze the model, the telemetry data, and the environmental data to understand why a false positive indicator occurred and adjust the model to more closely simulate the actual interaction and reduce the likelihood of future false positive indicators.

Referring now to FIG. 1, a network 1 comprising a plurality of components now is disclosed. Systems and methods for self-learning simulation environments may be implemented on network 1. Network 1 may comprise one or more clouds 2, which may be public clouds, private clouds, or community clouds. Each cloud 2 may permit the exchange of information, services, and other resources between various components that are connected to such clouds 2. In certain configurations, cloud 2 may be a wide area network, such as the Internet. In some configurations, cloud 2 may be a local area network, such as an intranet. Further, cloud 2 may be a closed, private network in certain configurations, and cloud 2 may be an open network in other configurations. Cloud 2 may facilitate wired or wireless communications between components and may permit components to access various resources of network 1.

Network 1 may comprise one or more servers that may store resources thereon, host resources thereon, or otherwise make resources available. Such resources may comprise, but are not limited to, information technology services, financial services, business services, access services, other resource-provisioning services, secured files and information, unsecured files and information, accounts, and other resources desired by one or more entities. More generally, such servers may comprise, for example, one or more of general purpose computing devices, specialized computing devices, mainframe devices, wired devices, wireless devices, and other devices configured to provide, store, utilize, monitor, or accumulate resources and the like.

Network 1 may comprise one or more devices utilized by one or more consumers of provided services. The one or more service providers may provide services to the one or more consumers utilizing the one or more servers, which connect to the one or more consumer devices via network 1. The services may comprise, for example, information technology services, financial services, business services, access services, and other resource-provisioning services. The devices may comprise, for example, one or more of general purpose computing devices, specialized computing devices, mobile devices, wired devices, wireless devices, passive devices, routers, switches, and other devices utilized by consumers of provided services.

Network 1 may comprise a plurality of systems, such as systems 4A-D. Each of the systems may comprise a plurality of components, such as devices 3A-M. Systems 4A-D may be one or more of a plurality of commercial, industrial, or consumer devices, such as cars, trucks, machinery, boats, recreational vehicles, equipment, servers, switches, refrigerators, heating systems, cooling systems, cooking instruments, timers, lighting systems, airplanes, buildings, payment terminals, computers, phones, tablets, shoes, safes, security systems, cameras, or any other conceivable device, for example.

Devices 3A-M may be one or more of a variety of devices, such as servers, consumer devices, lights, speakers, brakes, processors, instrumentation, servos, motors, cooling systems, heating systems, pumps, emissions systems, power systems, sensors (e.g., pressure sensors, temperature sensors, airflow sensors, velocity sensors, acceleration sensors, composition sensors, electrical sensors, position sensors), and combinations thereof, for example. More generally, devices 3A-M may be part of one or more systems deployed in the field or in a laboratory environment. Each of devices 3A-M may include an input/output ("I/O") device, such that each of devices 3A-M may transmit and receive information over network 1 to processing systems 100, others of devices 3A-M, and other systems or devices. Such transmitted information may include performance data (e.g., telemetry data) related to the device (e.g., position of the device, temperature near the device, air pressure near the device, environmental composition near the device, information indicating whether the device is functioning, log information identifying sources and/or recipients of information received and/or sent by the device and/or the nature of such information, information about components being monitored by the device, status information, other parameters), requests for information from other devices, and commands for other devices to perform particular functions, for example. Devices 3A-M may receive similar information from other devices. In some configurations, one or more of devices 3A-M may aggregate and process the received information and generate new information therefrom, such as summary information, forecast information, and other useful information for transmission to other devices, for example. In some configurations, components, such as device 3K, may operate independently and effectively function as a single-component system, for example.

Moreover, network 1 may comprise one or more processing system 100 that may collect and process data received from one or more components or systems within network 1, as will be described in more detail below. In some configurations, processing system 100 may be a server, a consumer device, a combination of a server and a consumer device, or any other device with the ability to collect and process data. Processing system 100 may include a single processor or a plurality of processors. In some configurations, processing system 100 may be implemented by an integrated device. In other configurations, processing system 100 may be implemented by a plurality of distributed systems residing in one or more geographic regions.

Figure 2:
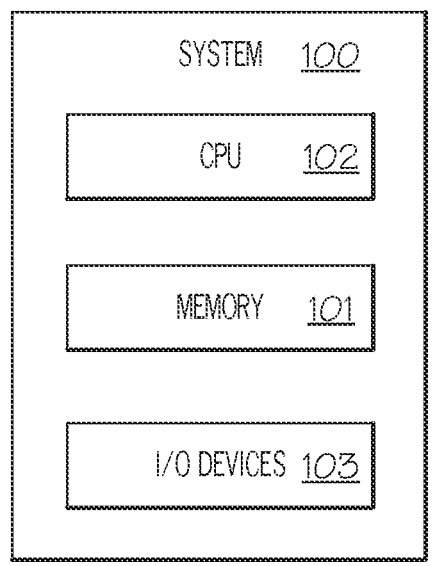
FIG. 2 is a schematic representation of a system configured to provide self-learning simulation environments.

Referring now to FIG. 2, processing system 100, which may be configured to implement self-learning simulation environments, now is described. System 100 may comprise a memory 101, a CPU 102, and an input and output ("I/O") device 103. Memory 101 may store computer-readable instructions that may instruct system 100 to perform certain processes. I/O device 103 may transmit data to/from cloud 2 and may transmit data to/from other devices connected to system 100. Further, I/O device 103 may implement one or more of wireless and wired communication between system 100 and other devices.

Figure 3:
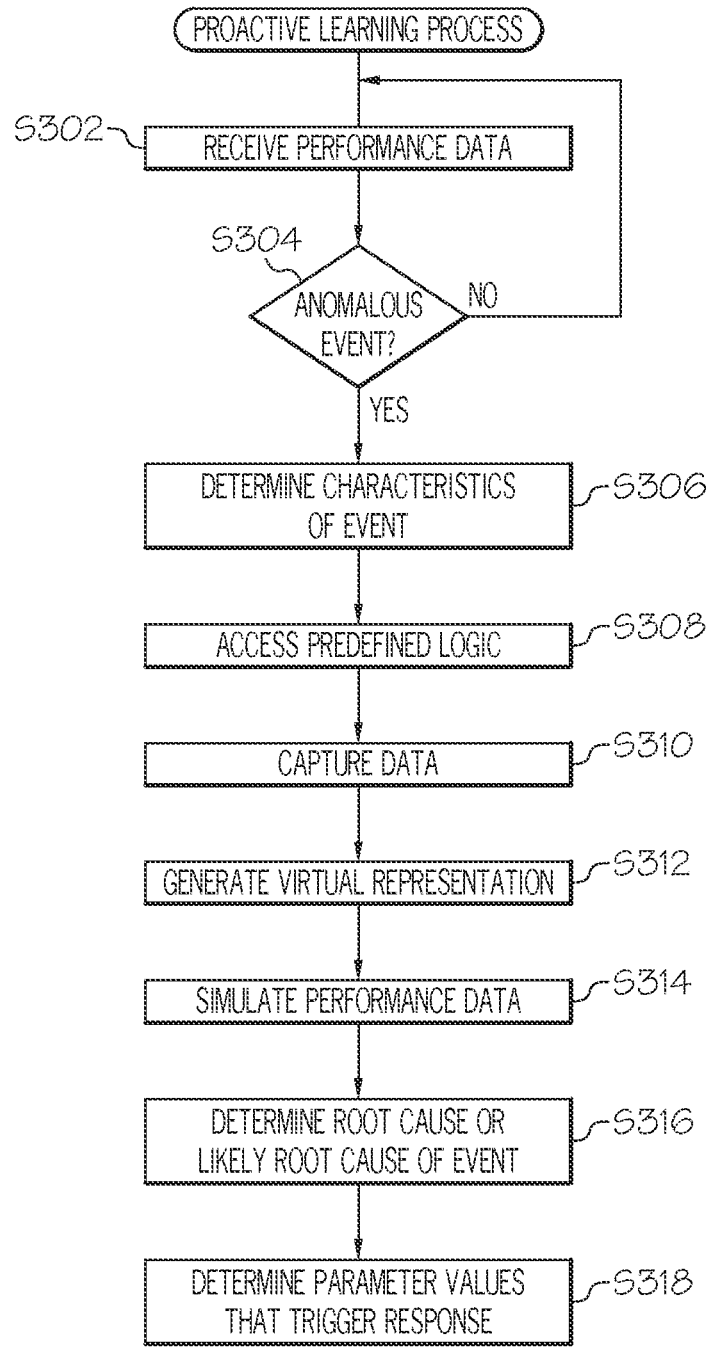
FIG. 3 illustrates a proactive learning process.

Referring now to FIG. 3, a proactive learning process now is described. In the proactive learning process of FIG. 3, processing system 100 may use telemetry data received from a plurality of devices, such as devices 3A-M, to determine whether an anomalous event (e.g., a significant loss of pressure in a wheel; the malfunctioning of a component; a significant temperature change; a strange location; other strange, unexpected, or otherwise notable behavior) has occurred. In response to determining that an anomalous event has occurred, processing system 100 may run repeated simulations using the telemetry data, other environmental data, and historical data to determine parameters of the telemetry data that may represent a root cause of the anomalous event. As a result, processing system 100 may establish criteria based on the parameters determined to be the root cause of the anomalous event, and such criteria may trigger proactive alerts, alarms, or corrective measures based on the received telemetry data prior to the occurrence of the anomalous event. This method may, for example, help system operators avoid or reduce the instances of anomalous events and subsequent disruptions to the operation of their systems.

Aspects of FIG. 3 are described below with reference to an example configuration involving a truck for purposes of explanation. Nevertheless, the process of FIG. 3 is not so limited and may be applicable to any network-enabled group of components and/or systems. For example, system 4B may be a truck, device 3D may be a location sensor (e.g., a global-positioning satellite ("GPS") element) for the truck, device 3E may be a diagnostic sensor for the truck, device 3F may be a temperature sensor for the truck, and device 3G may be a brainwave sensor for the driver of the truck.

In S302, system 100 may receive performance data (e.g., telemetry data) from components in the field. For example, system 100 may receive: current GPS coordinates for the truck from device 3D, the current status of the truck's engine and electrical systems (e.g., whether or not there is a malfunction) from device 3E, the current temperature outside of the truck from device 3F, and brainwave data for the driver from device 3G. System 100 may store the performance data in memory 101 to aggregate a history of performance data. In some configurations, system 100 also may receive performance data from other systems (e.g., systems 4A, 4C, and 4D) as well as data from the environment (e.g., traffic camera information, weather data).

In S304, system 100 may use the performance data to determine whether an anomalous event has occurred. System 100 may use predefined logic, adaptive models, or other learning-based algorithms to make the determination of S304. For example, if the GPS coordinates for the truck from device 3D indicate that the truck is no longer on the road and the status data from device 3E indicates that the truck's engine and electrical systems are no longer functioning, system 100 may determine that the truck has crashed (e.g., an anomalous event). In contrast, if the GPS coordinates for the truck from device 3D indicate that the truck is still on the road and the status data from device 3E indicates that the truck's engine and electrical systems are still functioning, system 100 may determine that the truck is operating normally (e.g., no anomalous event). If system 100 determines that an anomalous event has not occurred (S304: No), the process may return to S302, and system 100 may wait to receive further performance data. If system 100 determines that an anomalous event has not occurred (S304: No), the process may proceed to S306.

In S306, system 100 may determine the characteristics of the anomalous event. For example, system 100 may determine the nature of the anomalous event by identifying the values of the telemetry data (e.g., location, status, temperature, driver brainwave signal) for the truck that indicated the occurrence of the event. Such telemetry data may be established as characteristics of the event. In some configurations, the system may determine a more specific nature of the event (e.g., Did the truck crash? Did the truck run out of gas? Did the truck's battery die? Was the truck struck by lightning? Did the driver fall asleep?) in order to establish characteristics of the event.

In S308, system 100 may access a database storing predefined logic that indicates potential causes for anomalous events. The database may connect likely causes with associated characteristics of anomalous events. This may provide system 100 with the ability to access a more human interpretation of anomalous events, as the logic may be defined based on human experience. As an example, the predefined logic may indicate that driver brainwave patterns are highly relevant to crashes because crashes tend to occur when drivers fall asleep at the wheel and may also provide a typical brainwave pattern for a sleeping driver. The logic may also indicate that traffic volume is highly relevant to crashes because crashes tend to occur when the roads are busy. System 100 may compare the characteristics of the anomalous event determined in S306 with the logic in the database and determine which potential causes are more likely relevant to the anomalous events.

In S310, system 100 may obtain data related to the anomalous event from a plurality of sources. In some configurations, system 100 may obtain all data available during a particular time period prior to and including the time of the anomalous event. Such data may be global data or may be limited to data within a particular geographic region. Further, such data may come from a plurality of sources available to system 100, such as all components of the system associated with the anomalous event, other systems, environmental sensors, historical archives of data, and other available data sources, for example. Continuing the example in which it has been determined that system 4B (e.g., a truck) crashed (e.g., the anomalous event), system 100 may obtain a history of driving records for the driver from a remote database, brainwave data for the driver received from device 3G for 10 minutes preceding the crash, location data from systems 4A, 4C, and 4D for 5 minutes preceding the crash, data from traffic cameras located within 100 feet of the truck's location after the crash for 7 minutes preceding the crash, temperature information received from device 3F at the time of the crash, and location data for the truck received from device 3D for 5 minutes preceding the crash, for example.

In certain configurations, system 100 may initially obtain only data related to the likely causes of the anomalous event identified in S308. In the truck example, system 100 may initially obtain only brainwave data for the driver received from device 3G for 10 minutes preceding the crash, location data from systems 4A, 4C, and 4D for 5 minutes preceding the crash, and data from traffic cameras located within 100 feet of the truck's location after the crash for 7 minutes preceding the crash in such certain configurations, for example.

In S312, system 100 may generate a virtual representation of the system associated with the anomalous event (e.g., system 4B). The virtual representation may be one or more models of the system based on the data obtained in S310 and, in some configurations, a collection of historical data related to the anomalous event. For example, system 100 may generate a virtual representation of system 4B (e.g., the truck) including virtual representations of each of devices 3D-G. In some configurations, the virtual representation also may include virtual representations of devices 3A-C and 3H-M (and their respective systems 4A, 4C, and 4D) and of other components in the environment. For example, the virtual representation may include virtual representations of other vehicles (e.g., traffic), traffic signals, weather conditions (e.g., temperature, rain/shine/snow/fog), in addition to factors within system 4B, such as the driver's level of alertness (e.g., brainwave signals), the status of components of the truck (e.g., engine status, electrical system status), position of the truck (e.g., GPS position), the amount of fuel, the load of the truck, and other parameters that may have been acquired in S310, for example.

In S314, system 100 may use the virtual representation to repeatedly simulate interactions between the system associated with the anomalous event (e.g., system 4B), other systems (e.g., systems 4A, 4C, and 4D), and the environment to obtain simulated performance data for the system and its components (e.g., devices 3D-G). For example, system 100 may simulate an interaction by feeding the actual data obtained in S310 into the virtual representation for all parameters of the obtained data except one (e.g., temperature) and feeding simulated data into the virtual representation for that one parameter (e.g., simulated temperature data) to determine simulated performance data for the virtual representation of the system (e.g., system 4B), and to determine from the simulated performance data whether the virtual representation reproduced the anomalous event. System 100 may repeat this simulation a plurality of times by varying the simulated data for that one parameter to obtain additional sets of simulated performance data, which may be used to determine a correlation between that parameter and the occurrence of the anomalous event. System 100 may repeat this process by selectively varying other parameters (e.g., driver brainwaves, traffic patterns, traffic volume) as well. In particular configurations, a plurality of parameters may be varied simultaneously. For example, parameters of the data related to the system itself (e.g., location, driver brainwaves, engine status) may be varied while parameters of the data related to the environment (e.g., temperature, traffic volume, traffic patterns) may remain constant. Alternatively, parameters of the data related to the system itself (e.g., location, driver brainwaves, engine status) may remain constant while parameters of the data related to the environment (e.g., temperature, traffic volume, traffic patterns) may be varied. Parameters of each type of data (e.g., environmental data, system data) may be varied simultaneously. In some configurations, the virtual representation may utilize a plurality of models that weight the effect of different parameters of the data differently. In such configurations, a plurality of models may be simulated in a similar manner, such that a large number of simulations may be performed to generate a plurality of sets of performance data, which may be used to determine correlations between the various parameters (or combinations thereof) and the occurrence of the anomalous event. These simulations may be run in parallel to reduce time and quickly establish alert triggers.

In certain configurations, system 100 may initially run simulations based on only the data related to the likely causes of the anomalous event identified in S308. Such configurations may leverage human knowledge of the relationship between the anomalous event and such data to reduce the amount of processing required, and to quickly identify highly-correlated data parameters, as well as values of such data parameters that are likely to trigger the anomalous event.

Figure 4:
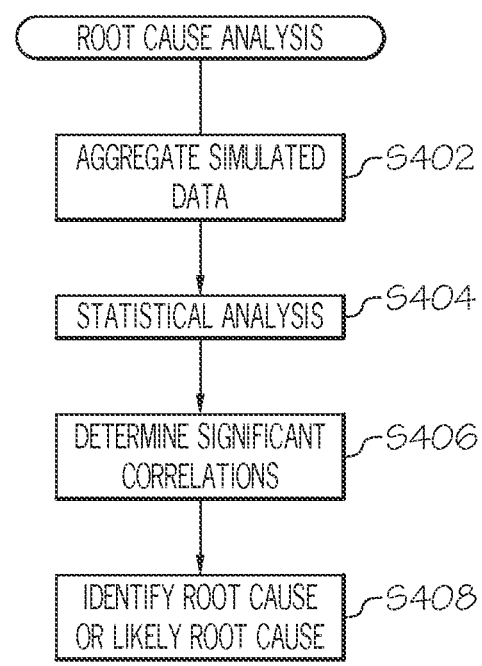
FIG. 4 illustrates a process of root cause analysis.

In S316, system 100 may use the sets of performance data generated in S316 to determine which data parameter(s) are root causes or likely root causes of the anomalous event. Referring now to FIG. 4, a process of root cause analysis now is described. The root cause analysis may determine which parameters of the data (e.g., brainwave activity, temperature, traffic volume, traffic patterns, fuel level, position) obtained in S310 are highly correlated to the anomalous activity (e.g., the crash). In this manner, a more accurate model for predicting the anomalous activity may be constructed and system 100 may identify additional sources of data (e.g., highly-correlated parameters) to obtain when monitoring the system in order to better predict occurrences of the anomalous event.

In S402, system 100 may aggregate the sets of performance data generated in S314. In some configurations, system 100 may normalize the performance data from one or more sets so that the performance data may be analyzed and processed in the aggregate.

In S404, system 100 may perform a statistical analysis of the aggregated performance data to determine correlations between each parameter of the data obtained in S310 and the occurrence of the anomalous event. More generally, system 100 may determine how various parameters of the data may interact to cause the anomalous event and learn which parameters or groups of parameters may be root causes of the anomalous event. System 100 also may determine values of such parameters that may, alone or in combination with certain values of other parameters, may have a high probability of causing the anomalous event. For example, system 100 may determine that a "drowsy" brainwave pattern for the driver has a 85% probability of causing a crash at the location where the truck crashed when the temperature is less than 30 degrees F., but has only a 65% chance of causing a crash at the location where the truck crashed when the temperature is more than 30 degrees F.

In S406, system 100 may, in some configurations, determine which parameters or groups of parameters are highly correlated with the occurrence of the anomalous event. For example, may determine whether the correlation of each parameter (or of a group of parameters) to the occurrence of the anomalous event (as determined in S404) is statistical significant, based on a predetermined significance criteria. If the correlation of a parameter (or a group of parameters) to the occurrence of the anomalous event is statistically significant, for example, system 100 may determine that the parameter (or group of parameters) is highly correlated with the occurrence of the anomalous event. In contrast, if the correlation of a parameter (or a group of parameters) to the occurrence of the anomalous event is not statistically significant, for example, system 100 may determine that the parameter (or group of parameters) is not highly correlated with the occurrence of the anomalous event. In alternative configurations, factors other than statistical significance may be used to determine which parameters or groups of parameters are highly correlated with the occurrence of the anomalous event.

In S408, system 100 may determine that the parameters or groups of parameters that were determined to be highly correlated with the occurrence of the anomalous event in S406 are the root causes of the anomalous event.

Returning to FIG. 3, further portions of the proactive learning process now are described. In S318, may determine establish trigger levels for alerts, alarms, or proactive actions associated with the anomalous event. In particular, system 100 may update a model for determining the occurrence of the anomalous event, such that the model incorporates the parameters or groups of parameters that were determined to be the root causes of the anomalous event in S408. System 100 also may update its data collection procedures to collect data for these parameters. In addition, system 100 may determine values for these parameters that will trigger alerts, alarms, or proactive measures related to the anomalous event.

For example, if the model predicts that the anomalous event will occur when a first parameter has a first value, a second parameter has a second value, and a third parameter has a third value, system 100 may establish a trigger level for these parameters such that alerts, alarms, or proactive measures related to the anomalous event occur when each of the values for the first parameter, the second parameter, and the third parameter are within 10% of the first value, the second value, and the third value, respectively.

In another example, the trigger level may be based on a probability that the anomalous event will occur. For example, system 100 may establish a trigger level such that alerts, alarms, or proactive measures related to the anomalous event occur when the anomalous event has a particular probability of occurring (e.g., the anomalous event has at least an 85% probability of occurring). Continuing the truck example in which system 100 determines that a "drowsy" brainwave pattern for the driver has a 85% probability of causing a crash at the location where the truck crashed when the temperature is less than 30 degrees F., but has only a 65% chance of causing a crash at the location where the truck crashed when the temperature is more than 30 degrees F., system 100 may establish an alert based on this information. For example, system 100 may use this information to define an alert regarding a driver's level of drowsiness that is triggered when (1) a truck is within a predetermined distance (e.g., 100 feet) of the location of the crash, (2) the driver has a "drowsy" brainwave pattern, and (3) the temperature is less than 30 degrees F. Such an alert may not be triggered if (1) the driver has an "alert" brainwave pattern, (2) the truck is not within the predetermined distance of the location of the crash, or (3) the temperature is 30 degrees F. or higher. In this manner, alerts, warnings, and other proactive measures may become more accurate and may be more likely to occur only when an anomalous event is likely to occur. Consequently, system 100 may continuously monitor and obtain data related to each of these parameters (e.g., brainwave activity, position, and temperature).

After S318, the proactive learning process may return to S302, and system 100 may wait to receive further performance data and start the proactive learning process again.

Figure 5:
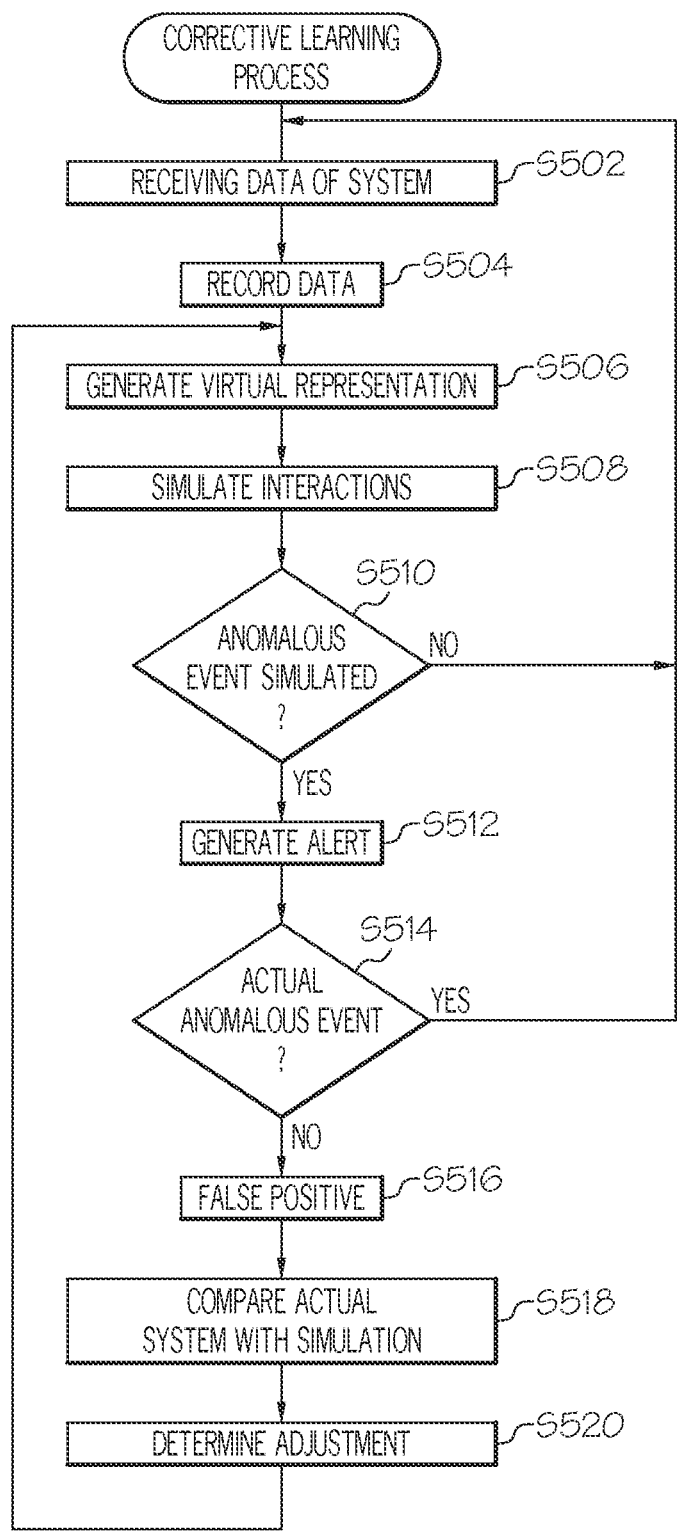
FIG. 5 illustrates a corrective learning process.

Referring now to FIG. 5, a corrective learning process now is described. In the corrective learning process of FIG. 5, system 100 may use performance data of a system, such as one or more of systems 4A-D, to determine why an alert, alarm, or other response to an anomalous event was triggered in a situation where the anomalous event did not occur. In other words, system 100 may analyze received performance data and other information to determine why the model used to predict an anomalous event inappropriately predicted the anomalous event and take measures to revise and correct the model to avoid future false-positive indicators of the anomalous event. This method may, for example, help system operators avoid untimely and annoying alerts and alarms as well as the inefficient use of resources associated with inappropriately taking proactive measures to avoid an anomalous event that is unlikely to occur.

In S502, system 100 may receive real-time performance data (e.g., telemetry data) from components in the field, such as components 3A-M. Returning to the truck example, system 100 may receive: current GPS coordinates for the truck from device 3D, the current status of the truck's engine and electrical systems (e.g., whether or not there is a malfunction) from device 3E, the current temperature outside of the truck from device 3F, and brainwave data for the driver from device 3G. In some configurations, system 100 also may receive performance data from other systems (e.g., systems 4A, 4C, and 4D) as well as data from the environment (e.g., traffic camera information, weather data). S502 may be similar to S302 described above.

In S504, system 100 may record the performance data received in S502. For example, system 100 may store the performance data in memory 101 to aggregate a history of performance data. In this manner, rich datasets of the performance data may be acquired and maintained for further analysis and data-mining.

In S506, system 100 may generate a virtual representation of the system being monitored (e.g., system 4B). The virtual representation may be one or more models of the system based on the data obtained in S502 and a collection of aggregated historical data related to the system, other systems, and the environment. For example, system 100 may generate a virtual representation of system 4B (e.g., the truck) including virtual representations of each of devices 3D-G. In some configurations, the virtual representation also may include virtual representations of devices 3A-C and 3H-M (and their respective systems 4A, 4C, and 4D) and of other components in the environment. For example, the virtual representation may include virtual representations of other vehicles (e.g., traffic), traffic signals, weather conditions (e.g., temperature, rain/shine/snow/fog), in addition to factors within system 4B, such as the driver's level of alertness (e.g., brainwave signals), the status of components of the truck (e.g., engine status, electrical system status), position of the truck (e.g., GPS position), the amount of fuel, the load of the truck, and other parameters that may have been acquired in S502, aggregated in S504, or collected and aggregated elsewhere, for example, S506 may be similar to S312 described above.

In S508, system 100 may use the virtual representation to repeatedly simulate interactions between the system being monitored (e.g., system 4B), other systems (e.g., systems 4A, 4C, and 4D), and the environment to obtain simulated performance data for the system and its components (e.g., devices 3D-G). Such simulations may use the real-time performance data received in S502 as a starting point to predict how the behavior of the system being monitored will evolve in time, including future interactions between the system, other systems, and the environment. Consequently, system 100 may generate one or more sets of simulated performance data based on the simulations in S508. S508 may be similar to S314 described above.

In S510, system 100 may analyze the simulated performance data to determine whether the simulated performance data indicates that an anomalous event has occurred, is likely to occur in the future (e.g., within a predetermined time period), or will occur in the future. In some configurations, system 100 may use predefined logic, adaptive models, or other learning-based algorithms to make the determination in a manner similar to that of S304 described above. In other configurations, system 100 may apply trigger levels, such as those set in S318 above, to make the determination. If system 100 determines that an anomalous event has not occurred, is not likely to occur in the future, or will not occur in the future (S510: No), system 100 may return to S502 and wait to receive additional performance data. If system 100 determines that an anomalous event has occurred, is likely to occur in the future, or will occur in the future (S510: Yes), system 100 may proceed to S512.

In S512, system 100 may generate an alert or alarm indicating that an anomalous event has occurred, is likely to occur, or will occur. The alert or alarm may recommend a course of action to address or avoid the anomalous event. In some configurations, system 100 may even take proactive measures to avoid the anomalous event, such as shutting down the system or components of the system, taking control of the system or components of the system, transferring control of the system to a remote operator, or another proactive action, for example.

In S514, system 100 may determine whether the anomalous event actually occurred. For example, system 100 may analyze the real-time performance data to determine whether the anomalous event actually occurred. In some configurations, system 100 may use predefined logic, adaptive models, or other learning-based algorithms to make the determination in a manner similar to that of S304 described above. Consequently, S514 may be similar to S304. If system 100 determines that the anomalous event actually occurred, system 100 may deem the model accurate and take specified corrective actions, as appropriate, and the process may return to S502, where system 100 may again wait to receive further performance data. If system 100 determines that the anomalous event did not actually occur, system 100 may proceed to S516 to begin determining why the anomalous event did not occur.

In S516, system 100 may determine that the simulated performance data created a false-positive indication of the anomalous event.

In S518, system 100 may, in response to one or more of the determination in S514 that the anomalous event did not actually occur and the determination in S516 that the simulated performance data created a false-positive indication of the anomalous event, analyze the actual performance data and the simulated performance data to identify differences in each set of data. For example, system 100 may compare the behavior of the virtual representation of the system being monitored (e.g., the simulated performance data) with the actual behavior of the system being monitored (e.g., the actual performance data) during the period when system 100 determined that the anomalous event was dangerously close to occurring. In some configurations, system 100 may analyze these differences to determine why the model incorrectly predicted the anomalous event. In certain configurations, system 100 may even determine that proactive measures taken by system 100 (or by an administrator of the monitored system) helped to prevent the anomalous event from occurring and led to the determination of a false-positive indicator of the anomalous event.

In S520, system 100 may determine an adjustment for the virtual representation of the monitored system based on the differences in the actual performance data and the simulated performance data identified in S518. The adjustment process is described in more detail below, with respect to FIG. 6. After determining the adjustment, system 100 may return to S506 and modify the model for the virtual representation of the monitored system, other systems, and the environment, such that the model incorporates the determined adjustment. Thereafter, system 100 may use the modified/adjusted model to generate the virtual representation of the monitored system in S506 and to simulate interactions between the monitored system, other systems, and the environment in S508.

Figure 6:
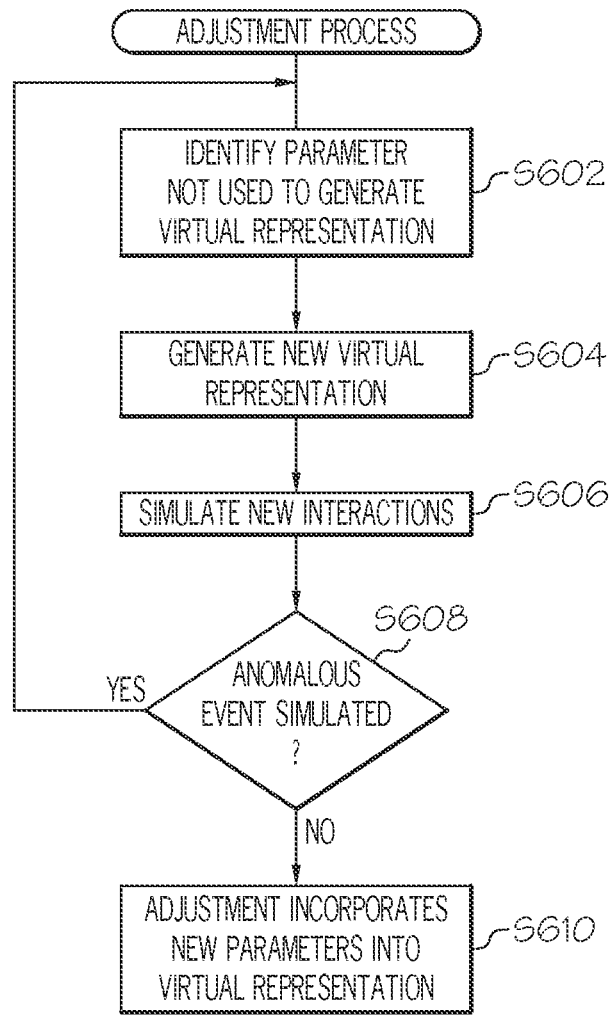
FIG. 6 illustrates an adjustment process.

Referring now to FIG. 6, an adjustment process now is described. As noted above, the adjustment process may determine one or more adjustments to the virtual representation of a monitored system based on the differences between performance data simulated using the model and actual performance data. In certain configurations, the adjustment process may be similar to the proactive learning process described above with respect to FIG. 3. The adjustment process of FIG. 6 may help to improve the accuracy of the virtual representation of the monitored system and the simulated performance data for the monitored system and may reduce instances of false-positive indicators of anomalous events, for example.

In S602, system 100 may analyze performance data received in S502, the history of performance data recorded in S504, and other available performance data for other systems and the environment (e.g., real-time and historical). System 100 may determine which parameters of the performance data are currently being used in the model for the virtual representation of the monitored system and identify parameters of the performance data that are not currently being used in the model for the virtual representation of the monitored system.

In S604, system 100 may generate one or more modified virtual representations of the monitored system in a manner similar to S506 based on modified models that incorporate one or more of the parameters of the performance data that were not used in the original model or that depend on previously-used parameters in different ways or to different extents. In some configurations, system 100 may generate a plurality of virtual representations based on a plurality of models.

In S606, system 100 may use the virtual representations generated in S604 to repeatedly simulate interactions between the monitored system, other systems, and the environment to obtain sets of simulated performance data for the system and its components in a manner similar to S508. The simulations may be based on the actual performance data collected during a predetermined period including the time of the false-positive indicator and the predicted time of the anomalous event. In some configurations, system 100 may simulate performance data for each of the plurality of virtual representations in parallel, such that rich sets of simulated performance data may be generated in a reduced amount of time compared with simulations performed in series.

In S608, system 100 may analyze the sets of simulated performance data to determine whether the simulated performance data indicates an occurrence or likely occurrence of the anomalous event in the predetermined period including the time of the false-positive indicator and the predicted time of the anomalous event. In some configurations, system 100 may use predefined logic, adaptive models, or other learning-based algorithms to make the determination in a manner similar to that of S304 described above. In some configurations of S608, system 100 may perform a process similar to the root cause analysis of FIG. 4 and use the information about the root cause to adjust the model of the monitored system. In certain configurations, S608 may be similar to S510.

If the simulated performance data indicates the occurrence or likely occurrence of the anomalous event in the predetermined period (S608: Yes), system 100 may determine that the model (e.g., the group of parameters and/or behaviors used to generate the virtual representation of the monitored system) is not accurate and system 100 may return to S602 to identify additional parameters or behaviors to incorporate into the model. If the simulated performance data indicates that the anomalous event would not occur or is unlikely to occur in the predetermined period (S608: No), system 100 may determine that the model (e.g., the group of parameters and/or behaviors used to generate the virtual representation of the monitored system) is accurate and system 100 may proceed to S610.

In S610, system 100 may determine that the model (e.g., the group of parameters and/or behaviors used to generate the virtual representation of the monitored system) used to simulate the performance data analyzed in S608 may more accurately predict occurrences (and non-occurrences) of the anomalous event than the currently used model. Consequently, system 100 may determine that the adjustment to the currently used model should incorporate the parameters and behaviors used in the model used to generate the simulated performance data analyzed in S608. System 100 subsequently may modify the virtual representation (e.g., the representation generated in S506) used to predict occurrences of the anomalous event to incorporate this adjustment, so that the virtual representation more accurately models the monitored system and more accurately predicts occurrences (and non-occurrences) of the anomalous event. For example, system 100 may adjust the model, such that predicted probability of the anomalous event occurring in the adjusted model would be reduced for the particular values of the performance data as compared with the non-adjusted model. In this manner, system 100 the likelihood of generating false-positive indicators of the anomalous event, such as inappropriate/untimely alerts, alarms, or proactive measures, may be reduced.

The terminology used herein is for the purpose of describing particular aspects only and is not intended to be limiting of the disclosure. As used herein, the singular forms "a," "an," and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of means or step plus function elements in the claims below are intended to comprise any disclosed structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. For example, this disclosure comprises possible combinations of the various elements and features disclosed herein, and the particular elements and features presented in the claims and disclosed above may be combined with each other in other ways within the scope of the application, such that the application should be recognized as also directed to other embodiments comprising other possible combinations. The aspects of the disclosure herein were chosen and described in order to best explain the principles of the disclosure and the practical application and to enable others of ordinary skill in the art to understand the disclosure with various modifications as are suited to the particular use contemplated.

What is claimed is:

1. A method comprising:
receiving performance data of a physical system;
determining whether an anomalous event has occurred in the physical system based on the performance data;
in response to determining that the anomalous event has occurred in the physical system, capturing data of the physical system and data of an environment of the physical system;
generating a first virtual representation of the physical system and the environment based on the captured data of the physical system and the captured data of the environment, wherein the first virtual representation comprises a plurality of actual parameters and at least one simulated parameter;
wherein values of the actual parameters are determined using the data of the physical system and the data of the environment of the physical system, and values of the at least one simulated parameter is determined using simulated data;
generating at least a second virtual representation that comprises the first virtual representation with the value of the at least one simulated parameter being varied from the first virtual representation;
using the first virtual representation and the at least a second virtual representation to determine a correlation between the at least one simulated parameter and the anomalous event;
determining which particular parameter of either the actual parameters or the at least one simulated parameter is likely a root cause of the anomalous event based on the correlation; and
determining particular values of the particular parameter that are likely the root cause of the anomalous event to use as alert triggers.

2. The method of claim 1, further comprising:
determining characteristics of the anomalous event; and
accessing predefined logic indicating a potential cause of an event with characteristics similar to the characteristics of the anomalous event,
wherein generating the at least a second virtual representation comprises selectively varying the at least one simulated parameter that is associated with the potential cause of the event with characteristics similar to the characteristics of the anomalous event.

3. The method of claim 1, further comprising:
selectively varying the values of the actual parameters of the captured data of the environment using the captured data of the physical system in an unvaried state.

4. The method of claim 1, further comprising:
selectively varying the values of the actual parameters of the captured data of the physical system using the captured data of the environment in an unvaried state.

5. The method of claim 1, wherein determining which particular parameter of either the actual parameters or the at least one simulated parameter is likely the root cause of the anomalous event comprises:
determining which particular parameter of the one or more parameters have statistically significant correlation to simulated performance data indicating that the anomalous event has occurred; and
determining that the particular parameter of the one or more parameters that has the statistically significant correlation to the simulated performance data indicating that the anomalous event has occurred is likely the root cause of the anomalous event.

6. The method of claim 1,
wherein the captured data of the physical system comprises data, which was transmitted by a plurality of components of the physical system, that was received within a predetermined period of time including a time of occurrence of the anomalous event, and
wherein the captured data of the environment comprises data, which was obtained by a plurality of sensors monitoring the environment, that was received within the predetermined period of time.

7. The method of claim 1,
wherein the particular values of the particular parameter that is likely the root cause of the anomalous event are values of the parameters that are within a range of values that are highly correlated to an occurrence of the anomalous event, and
further comprising issuing an alert indicating that the anomalous event is likely to occur again in response to determining that the particular parameter that is likely the root cause of the anomalous event has reached the particular values.

8. A system comprising:
a processing system configured to:
receive performance data of a physical system;
determine whether an anomalous event has occurred in the physical system based on the performance data;
in response to determining that the anomalous event has occurred in the physical system, capture data of the physical system and data of an environment of the physical system;
generate a virtual representation of the physical system and the environment based on the captured data of the physical system and the captured data of the environment;
repeatedly simulate performance data of the virtual representation by selectively varying one or more first parameters of the captured data of at least one of the physical system and the environment, while keeping one or more second parameters of the captured data of at least one of the physical system and the environment constant;
determine which parameters of the one or more first and second parameters are likely a root cause of the anomalous event based on the repeatedly simulated performance data of the virtual representation; and determine particular values of the parameters that are likely the root cause of the anomalous event to use as a trigger for a proactive process to address the anomalous event.

9. The system according to claim 8, wherein the processing system is further configured to:
determine characteristics of the anomalous event; and
access predefined logic indicating a potential cause of an event with characteristics similar to the characteristics of the anomalous event,
wherein, when selectively varying the one or more first parameters, the processing system is configured to:
initially vary parameters of the one or more first parameters that are associated with the potential cause of the event with characteristics similar to the characteristics of the anomalous event.

10. The system according to claim 8, wherein, when selectively varying the one or more first parameters, the processing system is configured to:
selectively vary the one or more first parameters of the captured data of the environment using the captured data of the physical system in an unvaried state.

11. The system according to claim 8, wherein, when selectively varying the one or more first parameters, the processing system is configured to:
selectively vary the one or more first parameters of the captured data of the physical system using the captured data of the environment in an unvaried state.

12. The system according to claim 8, wherein, when determining which parameters of the one or more first and second parameters are likely the root cause of the anomalous event, the processing system is configured to:
aggregate the simulated performance data of the virtual representation and associated values of the one or more first and second parameters used to simulate the simulated performance data;
determine a correlation between each parameter of the one or more first parameters and the simulated performance data;
determine which parameters of the one or more first parameters have statistically significant correlation to simulated performance data indicating that the anomalous event has occurred; and
determine that the parameters of the one or more first parameters that have statistically significant correlation to the simulated performance data indicating that the anomalous event has occurred are likely the root cause of the anomalous event.

13. The system according to claim 8,
wherein the captured data of the physical system comprises data, which was transmitted by a plurality of components of the physical system, that was received within a predetermined period of time including a time of occurrence of the anomalous event, and
wherein the captured data of the environment comprises data, which was obtained by a plurality of sensors monitoring the environment, that was received within the predetermined period of time.

14. The system according to claim 8,
wherein the particular values of the first parameters that are likely the root cause of the anomalous event are values of the parameters that are within a range of values that are highly correlated to an occurrence of the anomalous event, and wherein the proactive process to address the anomalous event is a process of issuing an alert indicating that the anomalous event is likely to occur in response to determining that the parameters that are likely the root cause of the anomalous event have reached the particular values.

15. A computer program product comprising:
a computer readable storage medium having computer readable program code embodied therewith, the computer readable program code comprising:
computer readable program code configured to receive performance data of a physical system;
computer readable program code configured to determine whether an anomalous event has occurred in the physical system based on the performance data;
computer readable program code configured to, in response to determining that the anomalous event has occurred in the physical system, capture data of the physical system and data of an environment of the physical system;
computer readable program code configured to generate a virtual representation of the physical system and the environment based on the captured data of the physical system and the captured data of the environment;
computer readable program code configured to repeatedly simulate performance data of the virtual representation by selectively varying one or more first parameters of the captured data of at least one of the physical system and the environment, while keeping one or more second parameters of the captured data of at least one of the physical system and the environment constant;
computer readable program code configured to determine which parameters of the one or more first and second parameters are likely a root cause of the anomalous event based on the repeatedly simulated performance data of the virtual representation; and
computer readable program code configured to determine particular values of the parameters that are likely the root cause of the anomalous event to use as a trigger for a proactive process to address the anomalous event.

16. The computer program product of claim 15, further comprising:
computer readable program code configured to determine characteristics of the anomalous event; and
computer readable program code configured to access predefined logic indicating a potential cause of an event with characteristics similar to the characteristics of the anomalous event,
wherein the computer readable program code configured to selectively vary the one or more first parameters comprises:
computer readable program code configured to initially vary parameters of the one or more first parameters that are associated with the potential cause of the event with characteristics similar to the characteristics of the anomalous event.

17. The computer program product of claim 15, wherein the computer readable program code configured to selectively vary the one or more first parameters comprises:
computer readable program code configured to selectively vary the one or more first parameters of the captured data of the environment using the captured data of the physical system in an unvaried state.

18. The computer program product of claim 15, wherein the computer readable program code configured to selectively vary the one or more first parameters comprises:

computer readable program code configured to selectively vary the one or more first parameters of the captured data of the physical system using the captured data of the environment in an unvaried state.

19. The computer program product of claim 15, wherein the computer readable program code configured to determine which parameters of the one or more first parameters are likely the root cause of the anomalous event comprises:

computer readable program code configured to aggregate the simulated performance data of the virtual representation and associated values of the one or more parameters used to simulate the simulated performance data;

computer readable program code configured to determine a correlation between each parameter of the one or more parameters and the simulated performance data;

computer readable program code configured to determine which parameters of the one or more parameters have statistically significant correlation to simulated performance data indicating that the anomalous event has occurred; and computer readable program code configured to determine that the parameters of the one or more parameters that have statistically significant correlation to the simulated performance data indicating that the anomalous event has occurred are likely the root cause of the anomalous event.

20. The computer program product of claim 15, wherein the captured data of the physical system comprises data, which was transmitted by a plurality of components of the physical system, that was received within a predetermined period of time including a time of occurrence of the anomalous event, and wherein the captured data of the environment comprises data, which was obtained by a plurality of sensors monitoring the environment, that was received within the predetermined period of time.

* * * * *